United States Patent
Otaka et al.

(10) Patent No.: US 7,397,648 B2
(45) Date of Patent: Jul. 8, 2008

(54) ELECTROSTATIC CHUCK INCLUDING A HEATER MECHANISM

(75) Inventors: Akinobu Otaka, Toyonaka (JP); Kazuyoshi Yamazaki, Wako (JP)

(73) Assignee: Momentive Performance Materials Inc., Wilton, CT (US)

( * ) Notice: Subject to any disclaimer, the term of this patent is extended or adjusted under 35 U.S.C. 154(b) by 478 days.

(21) Appl. No.: 10/985,718

(22) Filed: Nov. 10, 2004

(65) Prior Publication Data

US 2006/0098379 A1     May 11, 2006

(30) Foreign Application Priority Data

Nov. 10, 2003   (JP)   ............................... 2003-379997

(51) Int. Cl.
*H02N 13/00*   (2006.01)
(52) U.S. Cl. ..................................... 361/234
(58) Field of Classification Search ................. 361/234
See application file for complete search history.

(56) References Cited

U.S. PATENT DOCUMENTS

| 5,566,043 A | 10/1996 | Kawada et al. |
| 5,693,581 A | 12/1997 | Honma et al. |
| 5,796,074 A * | 8/1998 | Edelstein et al. ............ 219/390 |
| 6,239,402 B1 | 5/2001 | Araki et al. |
| 2004/0173161 A1 | 9/2004 | Mariner et al. |

FOREIGN PATENT DOCUMENTS

JP          07-307377          11/1995

* cited by examiner

*Primary Examiner*—Ronald W Leja
(74) *Attorney, Agent, or Firm*—Dominick G. Vicari

(57) ABSTRACT

An electrostatic chuck comprises a main body with a mounting surface and an opposed surface facing away from the mounting surface. At least one chucking electrode extends along the mounting surface of the main body and a first heater layer extends along the opposed surface of the main body. The electrostatic chuck can be used to heat and electrostatic ally attract a work piece, such as a wafer, to a work piece support surface during various processing techniques.

20 Claims, 2 Drawing Sheets

ELECTROSTATIC CHUCK INCLUDING A HEATER MECHANISM

FIELD OF THE INVENTION

The present invention relates to an electrostatic chuck including a heater mechanism particularly for use as a clamping device in a processing or manufacturing process of semiconductor wafer, Flat Panel Display (FPD) and other materials (glass, aluminum, high polymer substances, etc.) for various electronic devices.

BACKGROUND OF THE INVENTION

An electrostatic chuck including a heater mechanism is commonly employed to support a work piece (e.g., a silicon wafer) in a stationary position during various procedures. For example, electrostatic chucks including heater mechanisms may be used in filming processes such as Chemical Vapor Deposition (CVD), Physical Vapor Deposition (PVD), dry etching, or other processing techniques. Conventional work pieces can have a variety of shapes and sizes. Larger sized work pieces require precise and accurate positioning to perform a successful patterning operation.

A typical example of the conventional electrostatic chuck including a conventional heater mechanism is disclosed in Japanese patent publication No. 7-307377. The publication discloses an insulating substrate with an upper electrostatic chucking layer and a lower heater layer, which is surrounded by an electronically insulating layer of pyrolytic boron nitride (pBN) or other insulating materials.

The prior art electrostatic chuck may be incorporated as part of a conventional work piece supporting device, an example of which is schematically illustrated in FIG. 4. The conventional work piece supporting device includes an electrostatic chuck 10 wherein a source of voltage can be applied to electrostatic ally attract or clamp a work piece 12 to the chucking surface of the electrostatic chuck 10. A control circuit is also used to supply electricity to the lower heater layer of the chuck 10 to heat the mounting surface 11 of the electrostatic chuck 10. Heat transfer then occurs between the mounting surface 11 and the work piece 12 clamped thereto such that the work piece reaches an optimal temperature range suitable for processing the work piece. In order to prevent warping of the chuck 10, the chuck is secured to a metal base 14 by a plurality of bolts 16 or other fastening means.

In order to process a wafer by Metal Organic Chemical Vapor Deposition (MOCVD) or ion doping, the wafer may be subjected to an elevated temperature in the order of 800° C. or higher. Therefore, the work piece 12 must be heated within a relatively high temperature range while being electrostatic ally mounted to the metal base 14. However, in the configuration of the conventional mounting arrangement, a considerable part of the heat to the heater layer would be transferred to the metal base 14, causing the metal base 14 to act as an undesirable heat sink that interferes with proper heating of the wafer 12 to a high temperature range, say 800° C. Indeed, as shown in FIG. 4, the conventional chuck 10 includes a substantially flat plate with a substantially flat lower surface 18 in direct abutting contact with a substantially flat upper surface 20 of the metal base 14. Conduction of heat from conventional chuck 10 to the metal base 14 is enhanced since the substantially flat lower surface 18 is in direct abutting contact with the substantially flat upper surface 20 along substantially the entire width "W" of the chuck 10.

Due to the enhanced heat conductivity between the abutting substantially planar surfaces (18,20), a considerable portion of the heat generated by the heater layer would be transferred to the metal base 14 rather than the work piece 12. Losing heat to the metal base 14 can inhibit heat transfer to the work piece 12 and therefore render it difficult to heat the work piece within a sufficiently high temperature range, for example, above 800° C. Moreover, even if the work piece 12 can be successively heated to such a high temperature range, the clamping force must be decreased due to difference of thermal expansion between the bolts 16 and the chuck 10, resulting in potential failure of the capability of the metal base 14 from inhibiting, such as preventing, warp of the chuck 10. In addition, when the chuck 10 of a flat plate type is heated to an extremely high temperature such as 800° C. or higher, this is transferred to metallic terminals through which electricity is supplied to chucking electrodes of the chuck 10 so that the terminals may also be heated to substantially the same temperature. This may cause inferior electrical contact between the terminals and the chuck body due to difference of thermal expansion there between.

Further, when the electrostatic chuck 10 comprises a substantially flat plate that is mechanically secured to the warp correction metal base 14, as shown in FIG. 4, the effective work piece clamping area of the chucking surface can be decreased by the bolts 16 and or countersunk apertures to accommodate the bolts 16. Moreover, temperature distribution in the surface of the work piece 12 in contact with the chucking surface of the chuck 10 can be uneven due to thermal transfer from the periphery of the chuck 10 to the surrounding environment.

So-called facedown systems wherein the electrostatic chuck is placed with its chucking surface down have recently attracted considerable attention, because these systems tend to prevent or minimize adherence of particles generated during processing of the work piece. Facedown systems would also be advantageous in view of efficiency of reaction gas introduced during work piece processing. However, the device of FIG. 4 including a flat plate that is mechanically secured to a warp-connection base 14 is not applicable to the facedown system in a high temperature condition of 600° C. or higher.

SUMMARY OF THE INVENTION

In accordance with one aspect, an electrostatic chuck is provided with a main body comprising a mounting surface, an opposed surface facing away from the mounting surface, and a peripheral surface. At least one chucking electrode extends along the mounting surface of the main body and a first heater layer extends along the opposed surface of the main body. A second heater layer also extends along the peripheral surface of the main body.

In accordance with another aspect, an electrostatic chuck is provided with a main body comprising a mounting surface and an opposed surface facing away from the mounting surface. The electrostatic chuck further comprises at least one chucking electrode extending along the mounting surface of the main body and a heater layer extending along the opposed surface of the main body. A heat retainer is also provided that is adapted to inhibit heat transfer away from the main body. The heat retainer extends along the opposed surface of the main body.

In accordance with still a further aspect, an electrostatic chuck comprises a main body with a plate including a mounting surface and an opposed surface facing away from the mounting surface. The electrostatic chuck further comprises a reinforcing member extending away from the plate, wherein the reinforcing member is adapted to inhibit flexing of the plate. The electrostatic chuck further includes at least one chucking electrode extending along the mounting surface of the plate and a heater layer extending along the opposed surface of the plate.

Lastly, the invention relates to an electrostatic chuck provided with a main body comprising a mounting surface, an opposed surface facing away from the mounting surface, and a peripheral surface, the main body comprises a graphite substrate coated with an insulating material comprising at least one of a nitride, carbide, carbonitride or oxynitride of elements selected from a group consisting of B, Al, Si, Ga, refractory hard metals, transition metals, and rare earth metals, or complexes and/or combinations thereof.

BRIEF DESCRIPTION OF THE DRAWINGS

Other aspects and advantages of the present invention can be understood from the following description when read in conjunction with the accompanying drawings in which.

DETAILED DESCRIPTION OF EXAMPLE EMBODIMENTS

Figure 1:
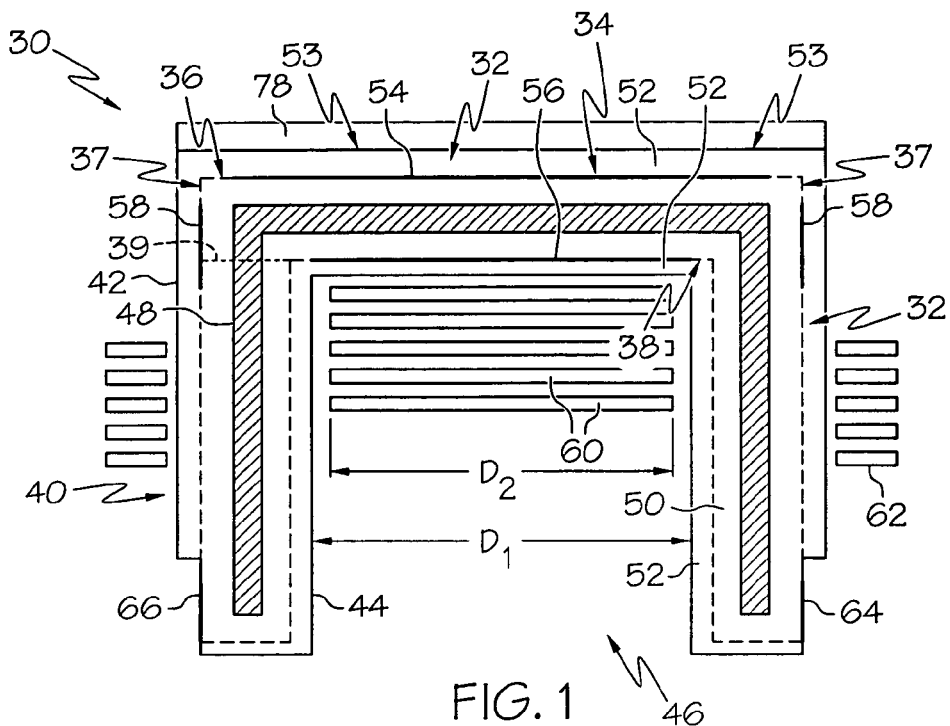
FIG. 1 is a diagrammatic cross-sectional view showing an electrostatic chuck including a heater mechanism in accordance with an embodiment of the present invention.

FIG. 1 shows an electrostatic chuck 30 including a heater mechanism in accordance with an embodiment of the present invention. The chuck 30 has a main body 32 that might comprise a wide range of materials and structure. In one embodiment, the main body 32 includes a core 48, such as a graphite core. The main body 32 can further include an electrical insulation layer 50, such as Pyrolytic Boron Nitride (PBN), covering or surrounding at least a portion of the core 48. As shown, the electrical insulation layer 50 covers the entire core 48.

Various electrical aspects in accordance with the invention may be associated with outer surfaces of the electrical insulation layer 50. For example, an electrically conductive material, such as Pyrolytic Graphite (PG), may be applied to the outer surfaces of the electrical insulation layer 50 to provide desirable functions to exemplary electrostatic chucks 30. For example, embodiments of the electrostatic chucks 30 include at least one chucking electrode 54 mounted to a surface of the insulating layer 50 to provide electrostatic attraction of a work piece toward the electrostatic chuck 30.

Embodiments of the electrostatic chucks 30 also include a heater layer 56 disposed on an opposed surface 38 facing away from the mounting surface 36. The heater layer 56 is adapted to raise the temperature of the main body 32 to a predetermined temperature to facilitate work piece processing techniques. To provide an even temperature distribution, particular embodiments of the electrostatic chuck 30 may also include another heater layer 58 disposed on a peripheral surface 37 of the main body 32. In one particular embodiment, the second heater layer 58 may be disposed on the peripheral surface 37 near the substantially flat mounting surface 36. Providing a heater layer 58 along a peripheral surface 37 may account for heat transfer that might otherwise flow laterally from the main body 32. Still further, the second heater layer 58 may comprise a single component or a plurality of components arranged about the peripheral surface. In the illustrated embodiment, the second heater layer 58 comprises a ring extending substantially continuously about the peripheral surface. In embodiments where the peripheral surface has a circular cylindrical shape, the second heater layer 58 can comprise a circular ring layer as disclosed by the various views of the FIGS. 1-3.

The electrostatic chuck 30 might also include at least one terminal formed from an electrically conductive material such as pyrolytic graphite (PG). The at least one terminal is adapted to supply electricity to the one or more heater layers and/or the at least one chucking electrode. For example, the electrostatic chuck 30 can include a first terminal 64 adapted to provide electricity to the chucking electrode and a second terminal 66 adapted to provide electricity to the first heater layer 56 and/or the second heater layer 58. As shown, the first terminal 64 and/or the second terminal 66 can be located at a second end portion 44 of a reinforcing member 40 in order to provide at least partial thermal isolation between the terminals and the heater layers. Indeed, positioning terminals 64, 66 at the second end portion 44 of the reinforcing member 40 can provide a sufficient isolation distance between heater layers 56, 58 and terminals 64, 66. The increased distance between the heater layers and terminals can reduce heat transfer from heater layers 56, 58 to PG terminals 64, 66. As the heater layers 56, 58 can reach temperatures in the order of 800° C. or higher, thermal isolation of the heater layers from the terminals may be desirable to discourage excessive temperature elevation of terminals 64, 66 that might otherwise prevent deterioration of terminals 64, 66 and assure supply of electricity to the chucking electrode 54 and one or more heater layers 56, 58.

In exemplary embodiments, electrically conductive material, such as PG, may be uniformly applied to an overall outer surface of the insulating layer 50. Then predetermined portions of the electrically conductive material may be selectively mechanically, chemically, or otherwise removed to produce the one or more heater layers, the at least one chucking electrode, and/or the one or more terminals.

The electrostatic chuck 30 can also include an optional overcoating layer 52 adapted to protect the main body 32. The overcoating layer 52 may be applied over an overall outer surface of the main body and over electrical elements (e.g., heater layer, chucking electrodes and/or terminals, etc.). Then selected portions of the overcoating layer 52 may be removed or worked to expose the one or more terminals 64, 66. The overcoating layer 52 may also include a substantially flat work piece surface 53 adapted to abut against a work piece 78 electrostatic ally clamped thereto.

The main body 32 can include a wide range of shapes and sized depending upon the particular application. In exemplary embodiments, the main body 32 might comprise a substantially planar member extending substantially entirely along a planar surface. As shown in FIG. 1, particular embodiments of the electrostatic chuck 30 might comprise a plate 34, such as a substantially flat plate, with one or more reinforcing members 40 adapted to inhibit flexing of the plate 34. The reinforcing member can comprise a rib or protrusion adapted to increase the overall bending moment of inertia of the plate 34. As shown in FIG. 1, the reinforcing member 40 comprises a wall having a first end portion 42 attached to the plate 34 and a second end portion 44 offset from the plate wherein the wall extends from the first end portion attached to the plate 34 and a second end portion 44 offset from the plate 34. Providing a wall extending from the first end portion to the second end portion can inhibit flexing of the plate 34 under the influence of thermal or mechanical stresses that would otherwise bend the plate. Moreover, providing an offset second end portion 44 provides a mounting location for the one or more terminals 64, 66 to inhibit heat transfer from the heater layers to the terminals.

In further embodiments, the wall may extend substantially or entirely about a peripheral area of the plate 34. For example, the reinforcing member 40 might comprise a non-continuous or substantially continuous cylindrical wall wherein the first end portion 42 of the wall is attached at a lower peripheral area 39 of the plate 34. A portion of the peripheral area 39 is designated with broken lines. In one particular example, as apparent from the top plan view shown in FIG. 2, the cylindrical wall of each embodiment of the present invention may have a substantially circular cross section and the plate 34 may comprise a substantially circular plate wherein the first end portion of the wall is attached at a lower circular peripheral area 39 of the plate 34. Providing a substantially circular surface may distribute heat in a better manner and may better receive a circular shaped work piece.

It is therefore apparent that the main body 32 can be formed with a substantially inverted-cup-like shape. While the core 48 can comprise graphite, it is contemplated that the entire main body 32 and the overcoating layer 52 may be made from PBN.

In one embodiment of a method to manufacture the main body 32 (e.g., inverted-cup-shaped main body), the method comprises machining a graphite block to obtain the desired shape for the graphite core 48. In one particular embodiment, the graphite block is machined into an inverted-cup-shaped core 48 having a material thickness of 3-20 millimeters. Next, the core 48 may then be covered by a PBN insulating layer 50 of 100-200 micrometers in a CVD chamber. Main body 32 formed from PBN alone in one embodiment has a thickness of 0.5-2 millimeters.

After the main body 32 is manufactured in the above-described manner, a PG layer having thickness, for example in the order of 50 micrometers, is formed on the entire upper surface of the top plate 34 of the main body 32 in a CVD chamber. The PG layer is partly removed to form a predetermined pattern of chucking electrodes 54 on the top plate 34. In like manner, heater layers 56, 58 can be formed on the lower surface of top plate 34 and on the upper end peripheral portion of the reinforcing portion 40, respectively, of main body 32.

Terminals 64, 66 can be fabricated from pyrolytic graphite (PG), which is the same material used to fabricate the chucking electrodes 54 and heater layers 56, 58. More specifically, a PG covering having thickness, for example in the order of 50 micrometers, is formed in a CVD chamber to surround (e.g., completely surround) the main body 32. The PG covering may then be partly removed so that a predetermined pattern of one or more chucking electrodes 54 is formed on the upper surface of top plate 34, heater layer 56 is formed on the lower surface of top plate 34, and heater layer 58 and terminals 64, 66 are formed on a periphery of the main body 32. Then, overcoating layer 52 is formed to entirely surround main body 32 with chucking electrodes 54, heater layers 56, 58 and terminals 64, 66, followed by partial removal thereof at the lower end periphery to expose terminals 64, 66 for electric connection.

In certain embodiments, the first heat layer 56 might be provided with a first heat retainer or heat reflector 60 extending along the opposed surface 38 of the main body 32. The first heat retainer 60, if provided, is adapted to inhibit heat transfer away from the main body 32. Inhibiting heat transfer away from the main body 32 may facilitate the heating function of the first heat layer 56 to direct heat toward the top plate 34 rather than being released to the surrounding environment. In addition, or alternatively, the second heat layer 58, if provided, may also include a second heat retainer 62 extending along the peripheral surface 37 of the main body 32. The second heat retainer or heat reflector 62, if provided, is adapted to inhibit heat transfer away from the main body 32. Inhibiting heat transfer away from the main body 32 may also facilitate the heating function of the second heat layer 58 to direct heat toward the top plate 34 rather than being released to the surrounding environment.

Figure 2:
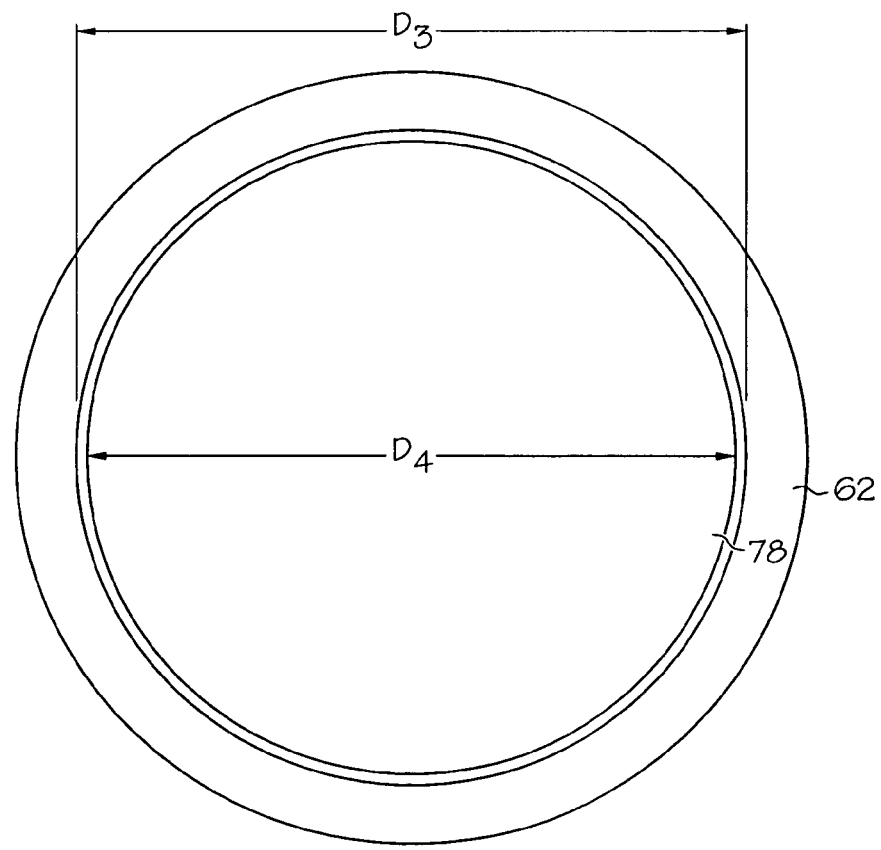
FIG. 2 is a top plan view of the electrostatic chuck of FIG. 1.

The heat retainers, if provided, may comprise a wide variety of shapes and sizes sufficient to inhibit heat transfer away from the main body. For example, the first heat retainer 60 may include an outer diameter "$D_2$" that is slightly less than the cavity diameter "$D_1$" of the interior cavity 46. Thus, the first heat retainer may be positioned in the interior cavity 46 and extend substantially along the entire opposed surface 38 to minimize heat loss. In addition, the second heat retainer 62 may include an inner diameter "$D_3$" that is slightly larger than the outer diameter "$D_4$" of a portion of the electrostatic chuck 30 to provide substantially continuous close proximity between the second heat retainer 62 and the references portion of the electrostatic chuck 30. As shown in FIGS. 1 and 2, the second heat retainer 62 can comprise a ring with an interior opening to accommodate the referenced portion of the main body.

The heat retainers may also comprise a plurality of offset, relatively thin, members. For example, the first heat retainer 60 can comprise a plurality of offset, relatively thin, disks. In addition, the second heat retainer 62 can comprise a plurality of offset, relatively thin, rings. Providing a plurality of relatively thin members, offset from one another, may provide maximum thermal resistance due to the air or other insulating barrier that exists between each corresponding pair of offset disks.

In particular embodiments, the heat retainer may comprise a reflector adapted to reflect heat back toward the main body. In additional alternative embodiments, the heat retainer might comprise an insulation material adapted to provide a heat barrier. Examples of insulation materials include carbon foam, the insulating second material comprising the inner layer may, for example, be reticulated vitreous carbon, graphite felt, ceramic foam, ceramic felt, impregnated microspheres of carbon, or impregnated microspheres of ceramic. In one embodiment, the insulation material comprises a ceramic felt insulation. In another embodiment, the insulation material comprises a flexible insulating ceramic fiber blanket having a thermal conductivity of less than about 0.035 watt/m ° K. and stabilizes at a surface temperature of about 30° C.

The first heat reflector 60 may comprise a single layer. Alternatively, the heat reflector may comprise multiple layers, or several pieces combined to form a unified body. In one embodiment, the heat reflector 60 comprises a plurality of thin disks. In one embodiment, the heat reflector is made from an insulating material such as PBN when additional insulation is needed. In another embodiment, the heat reflector comprises a metal having high fusion point such as molybdenum, stainless steel, or any other suitable material, which inhibits escape of heat from heater layer 56 which has been heated to a predetermined high temperature, and facilitates heat transfer from the heater layer 56 to the work piece 78 supported on the electrostatic chuck 30. An interior cavity 46 defined by the wall may be used to house any desired number of the reflector disks that might be used as the first heat retainer 60.

The second heat reflector 62 can be of similar construction and material as of the first heat reflector 60, i.e., it may comprise a plurality of thin rings made from PBN, metal having high fusion point such as molybdenum, stainless steel, or any other suitable material. The second heat reflector 62 prevents escape of heat from heater layer 58 which has been heated to a predetermined high temperature, and facilitates heat transfer from the heater layer 58 be transferred upward to work piece 78 supported on chuck 30.

Heat reflectors 60, 62 may be fixed to a support surface (not shown) by bolts made from high-fusion-point metal such as molybdenum, or by ceramic bolts, or by any other suitable means. It will be appreciated that the heat reflectors can contribute to effective heat transfer from the first and second heat layers to the work piece on the electrostatic chuck.

The overcoating layer 52 that substantially surrounds main body 32 to entirely cover the chucking electrode 54 and heater layers 56, 58 is made from PBN, that is the same material with insulating layer 50. In one embodiment, the insulating material has an electrical resistivity of between 10 sup 8 and 10 sup 13 $\Omega$-cm ($10^8$-$10^{13}$ $\Omega$-cm). Overcoating layer 52 having such a range of the electrical resistivity allows a minimal current to pass through overcoating layer 52 and work piece 78, which greatly increases the electrostatic attraction force as known in the art as a "Johnsen-Rahbek" effect. A PBN compact produced by a CVD process has an electrical resistivity of the order of ~$10^{15}$ $\Omega$-cm at a room temperature, but this is lowered to $10^8$-$10^{12}$ $\Omega$-cm at a temperature of 800° C. or higher, which successfully provides a favorable electrostatic chucking force by the "Johnsen-Rahbek" effect.

The core 48 can be a solid graphite body, either conventional graphite or pyrolytic graphite. Pyrolytic graphite is essentially highly oriented polycrystalline graphite produced by high temperature pyrolysis of a hydrocarbon gas such as methane, ethane, ethylene, natural gas, acetylene and propane.

The overcoating layer 52 and the insulating layer 50 may be made from materials other than pyrolytic boron nitride. In one embodiment of the invention, the layers are of the same materials or can be of different materials, comprising at least one of a nitride, carbide, carbonitride or oxynitride of elements selected from a group consisting of B, Al, Si, Ga, refractory hard metals, transition metals, and rare earth metals, or complexes and/or combinations thereof. Examples include aluminum nitride, titanium aluminum nitride, titanium nitride, titanium aluminum carbonitride, titanium carbide, silicon carbide, and silicon nitride. In a second embodiment, the layer 52 comprises AlN. In a third embodiment, the layer 50 comprises a complex of AlN and BN. In a fourth embodiment, the overcoating dielectric layer comprises a composition of pyrolytic boron nitride (PBN) and a carbon dopant in an amount of less than about 3 wt % such that its electrical resistivity is smaller than $10^{14}$ $\Omega$-cm. In yet a fifth embodiment, the overcoating layer comprises an aluminum nitride wherein a small amount of $Y_2O_3$ is added, e.g. in amount of 5 wt % relative to 100 wt % of aluminum nitride. Both pBN and AlN have excellent insulating and conducting properties and can be easily deposited from the gaseous phase. They also have a high temperature stability.

Figure 3:
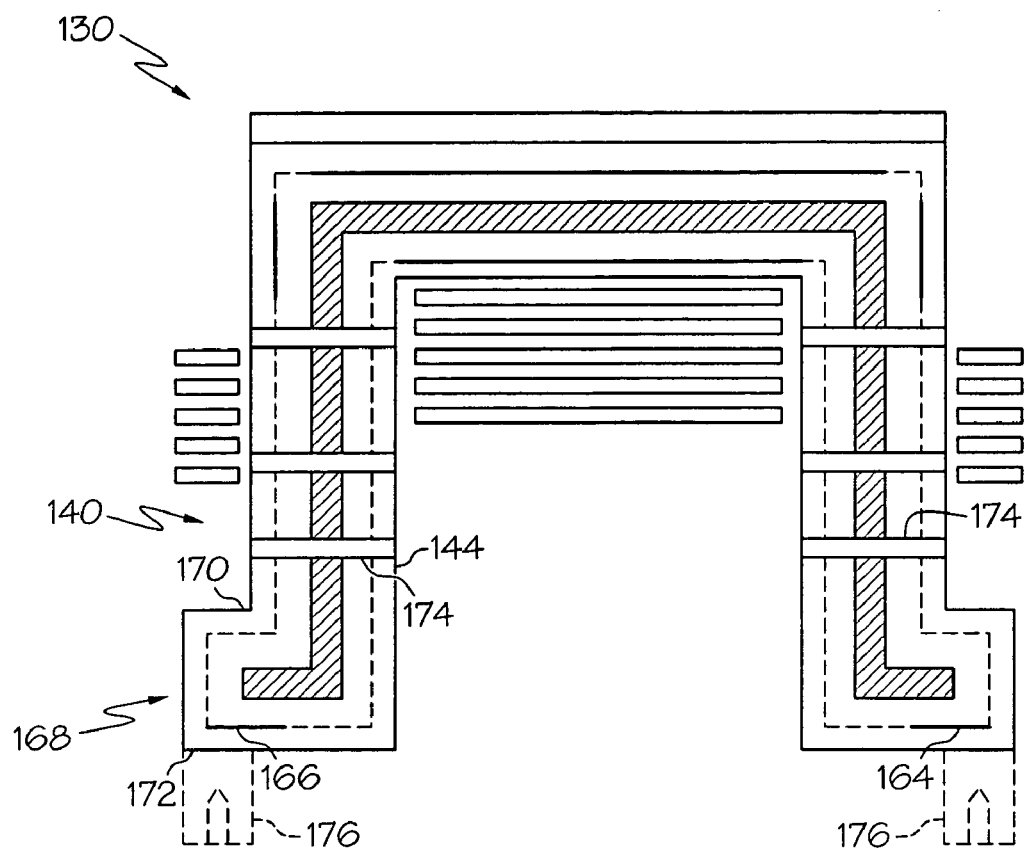
FIG. 3 is a diagrammatic cross-sectional view showing an electrostatic chuck including a heater mechanism in accordance with another embodiment of the present invention.
Figure 4:
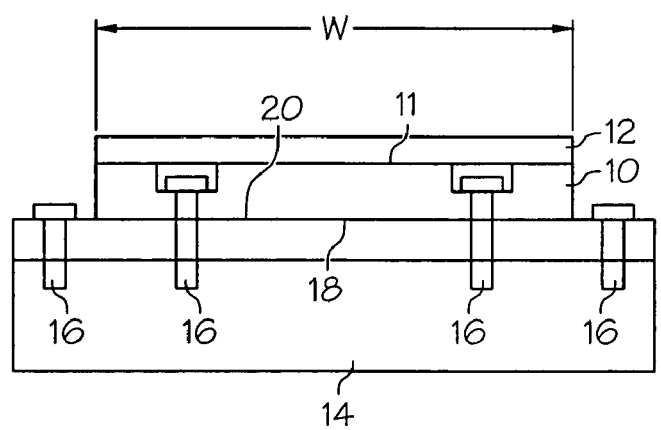
FIG. 4 is a schematic side view showing a conventional electrostatic chuck with a conventional heater mechanism.

FIG. 3 shows an electrostatic chuck 130 including a heater mechanism in accordance with another embodiment of the present invention. Chuck 130 is quite similar to chuck 30 of FIG. 1. In the FIG. 1, chuck 30 has an inverted-cut-shaped main body of a top plate and cylindrical sidewall, whereas chuck 130 has the shape of an inverted hat, i.e., further including a foot 168, such as a circumferential (e.g., circular circumferential) foot, having a first end 170 attached to the second end portion 144 of the wall and a second end portion 172 extending away from the second end portion of the wall. In addition, the terminals 164, 166 may be formed on the bottom of the foot 168 that effectively prevents discharge of electricity from the terminals. In certain embodiments, terminals 164 and/or 166 can be replaced by one or more post terminals 176 (i.e., shown in imaginary lines in FIG. 3). Post terminals 176 may be more effective to prevent deterioration of terminals and discharge of electricity. Foot 168 also provides favorable attachment means for securing chuck 130 to the support surface. Fastening means such as bolts may be inserted through vertically extending holes in foot 168 and screwed into corresponding female screws in the support surface. Still further, the embodiments of the present invention (e.g., as shown in FIGS. 1-3) might include one or more apertures in the reinforcing member to further thermally isolate the terminals from the heater layers. For example, as shown in FIG. 3, the reinforcing member 140 might include one or more apertures 174 adapted to minimize heat transfer along the reinforcing member 140. Apart from these points, the structure and function of the electrostatic chuck 130 can be considered identical with the structure and function previously discussed with respect to the electrostatic chuck 30.

Accordingly, the embodiments of electrostatic chucks in accordance with the present invention can have a wide range of alternative inventive features. For example, certain electrostatic chucks include a lower end of a cylindrical sidewall or a foot that can be used as an attachment to be secured to a support surface. Accordingly, the heating layers, e.g., the first heating layer mounted on the lower surface of the top plate and the second heating layer mounted on the outer surface of the cylindrical wall of the main body at a position close to the upper end thereof are not only held in no contact with the support surface but sufficiently spaced therefrom. The first heat retainer can comprise a heat reflector including a desired number of reflector disks positioned within an interior cavity of an inverted-cup-shaped (without foot) or inverted-hat-shaped (with foot) main body. The second heat retainer can comprise a heat reflector including a desired number of reflector rings surrounding the cylindrical sidewall of the main body. These features cooperate with each other to contribute to effective heat transfer from the heating layers to the work piece (e.g., wafer), while preventing heat escape to the support surface underneath. This makes it possible to quickly and uniformly heat the work piece to 600° C. or higher temperature.

In addition, in accordance with certain particular embodiments of the invention, the terminals for supplying electricity to the chucking electrode and the heater layers can be provided at a lower position remote from the heater layers. This prevents excessive temperature elevation of the electricity supplying terminals, even when the heater layers are heated to a high temperature, thereby maintaining quality of the terminals and preventing inferior electrical contact that may be caused by thermal expansion of the terminals of metallic material.

Certain embodiments of the invention might involve an inverted-cup-shaped chuck that has a downward extending cylindrical sidewall. In another embodiment, the chuck may have a bowl shape with a flat bottom and sloped or smooth curved and straight extending sidewall. Further embodiments of the invention might also comprise a hat-shaped chuck that has the outward extending foot at the lower end of the cylindrical sidewall. The lower end portion of the cylindrical side wall or the outwardly extending foot may be used for fixing the chuck to the support surface, which does not require bolt holes through the work piece chucking surface and thereby maximizes the effective area of the chucking surface and provides uniform temperature distribution to the work piece (e.g., wafer).

Further, the electrostatic chuck in accordance with the present invention can be employed as part of a facedown system wherein the chuck is placed with its chucking support surface facing down. This system prevents or minimizes adherence of particles, which may be generated during the work piece processing, to the work piece, and improves the efficiency of reaction gas introduced during the work piece processing.

Although the present invention has been described in conjunction with specific embodiments thereof, it is to be understood that the present invention is not limited to these embodiments and many modifications and variations may be made without departing from the scope and spirit of the present invention as specifically defined in the appended claims.

What is claimed:

1. An electrostatic chuck comprising:
 a main body encapsulated in an insulating coating layer, said main body comprising a mounting surface, an opposed surface facing away from the mounting surface, and a peripheral surface;
 at least one chucking electrode extending along the mounting surface of the main body;
 a first heater layer extending along the opposed surface of the main body;
 a second heater layer extending along the peripheral surface of the main body;
 a plurality of terminals located on said peripheral surface, and
 a first heat retainer adapted to inhibit heat transfer away from the main body, wherein the first heat retainer extends along the opposed surface of the main body and comprises a plurality of adjacent disks.

2. The electrostatic chuck of claim 1 for heating a wafer to a temperature of at least 800° C.

3. The electrostatic chuck of claim 2, wherein said insulating coating layer comprises at least one of a nitride, carbide, carbonitride or oxynitride of elements selected from a group consisting of B, Al, Si, Ga, refractory hard metals, transition metals, and rare earth metals, or complexes and/or combinations thereof.

4. The electrostatic chuck of claim 3, wherein said main body comprises pyrolytic graphite and said insulating coating layer comprises pyrolytic boron nitride.

5. The electrostatic chuck of claim 1, further including a second heat retainer adapted to inhibit heat transfer away from the main body, wherein the second heat retainer extends along the peripheral surface of the main body.

6. The electrostatic chuck of claim 5, wherein the second heat retainer comprises a plurality of rings.

7. The electrostatic chuck of claim 1, wherein said main body has an inverted cup shape, an inverted bowl shape, or an inverted hat shape.

8. An electrostatic chuck comprising:
 a main body encapsulated in an insulating coating layer, said main body comprising a mounting surface and an opposed surface facing away from the mounting surface;
 at least one chucking electrode extending along the mounting surface of the main body;
 a heater layer extending along the opposed surface of the main body;
 and a heat retainer adapted to inhibit heat transfer away from the main body and extending along the opposed surface of the main body, wherein the heat retainer comprises a plurality of adjacent disks.

9. The electrostatic chuck of claim 8, wherein said insulating coating layer comprises at least one of a nitride, carbide, carbonitride or oxynitride of elements selected from a group consisting of B, Al, Si, Ga, refractory hard metals, transition metals, and rare earth metals, or complexes and/or combinations thereof.

10. The electrostatic chuck of claim 9, wherein said main body comprises pyrolytic graphite and said insulating coating layer comprises pyrolytic boron nitride.

11. The electrostatic chuck of claim 8, wherein the heat retainer comprises a heat reflective material.

12. The electrostatic chuck of claim 8, wherein the heat retainer comprises an insulation material.

13. An electrostatic chuck comprising:
 a main body encapsulated in an insulating coating layer, said main body comprising a mounting surface and an opposed surface facing away from the mounting surface;
 at least one chucking electrode extending along the mounting surface of the main body; a heater layer extending along the opposed surface of the main body;
 and a heat retainer adapted to inhibit heat transfer away from the main body and extending along the opposed surface of the main body, wherein the heat retainer comprises a ceramic felt insulation material.

14. An electrostatic chuck comprising:
 a main body encapsulated in an insulating coating layer, said main body comprising a plate including a mounting surface and an opposed surface facing away from the mounting surface, and a reinforcing member extending away from the plate, wherein the reinforcing member is adapted to inhibit flexing of the plate;
 at least one chucking electrode extending along the mounting surface of the plate;
 a heater layer extending along the opposed surface of the plate, wherein said insulating coating layer comprises at least one of a nitride, carbide, carbonitride or oxynitride of elements selected from a group consisting of B, Al, Si, Ga, refractory hard metals, transition metals, and rare earth metals, or complexes and or combinations thereof:
 wherein the reinforcing member comprises a wall having a first end portion attached to the plate and a second end portion offset from the plate wherein the wall extends from the first end portion to the second end portion
 wherein the wall and the plate define an interior cavity
 wherein the electrostatic chuck further comprises a heat retainer adapted to inhibit heat transfer away from the main body, wherein the heat retainer is positioned in the interior cavity and extends along the opposed surface of the main body and wherein the heat retainer comprises a plurality of adjacent disks, and each of the plurality of disks includes an outer diameter that is slightly less than a cavity diameter of the interior cavity.

15. The electrostatic chuck of claim 14, further comprising a first terminal adapted to supply electricity to the chucking electrode and a second terminal adapted to supply electricity to the heater layer, wherein the first and second terminals are each mounted at the second end portion of the wall.

16. The electrostatic chuck of claim 14, wherein the wall comprises a substantially cylindrical wall and the first end portion of the wall is attached at a peripheral area of the plate.

17. The electrostatic chuck of claim 16, wherein the cylindrical wall has a substantially circular cross section and the plate comprises a substantially circular plate wherein the first end portion of the wall is attached at a circular peripheral area of the plate.

18. The electrostatic chuck of claim 14, further comprising a foot having a first end attached to the second end portion of the wall and a second end extending away from the second end portion of the wall.

19. An electrostatic chuck comprising:
- a main body encapsulated in an insulating coating layer, said main body comprising a plate including a mounting surface and an opposed surface facing away from the mounting surface, and a reinforcing member extending away from the plate, wherein the reinforcing member is adapted to inhibit flexing of the plate;
- at least one chucking electrode extending along the mounting surface of the plate; and
- a heater layer extending along the opposed surface of the plate, wherein said insulating coating layer comprises at least one of a nitride, carbide, carbonitride or oxynitride of elements selected from a group consisting of B, Al, Si, Ga, refractory hard metals, transition metals, and rare earth metals, or complexes and/or combinations thereof, wherein the reinforcing member comprises a wall having a first end portion attached to the plate and a second end portion offset from the plate wherein the wall extends from the first end portion to the second end portion, and wherein the wall includes a plurality of apertures adapted to inhibit heat transfer from the first end portion towards the second end portion of the wall.

20. The electrostatic chuck of claim 19 for heating a wafer to a temperature of at least 800° C.

* * * * *